United States Patent [19]
Kimura

[11] Patent Number: 5,869,392
[45] Date of Patent: Feb. 9, 1999

[54] METHOD OF FABRICATING A SEMICONDUCTOR DEVICE INCLUDING A PLURALITY OF CONTACT REGIONS DISPOSED AT DIFFERENT DEPTHS

[75] Inventor: Tadayuki Kimura, Kanagawa, Japan

[73] Assignee: Sony Corporation, Tokyo, Japan

[21] Appl. No.: 762,778

[22] Filed: Dec. 10, 1996

[30] Foreign Application Priority Data

Dec. 12, 1995 [JP] Japan ..................................... 7-346183

[51] Int. Cl.$^6$ ................................................... H01L 21/28
[52] U.S. Cl. .......................... 438/620; 438/624; 438/633; 438/634; 438/648
[58] Field of Search .................................... 438/233, 622, 438/624, 625, 629, 631, 633, 637, 672, 352, 355, 620, 627, 643, 648

[56] References Cited

U.S. PATENT DOCUMENTS

| | | | |
|---|---|---|---|
| 4,996,167 | 2/1991 | Chen | 438/620 |
| 5,210,053 | 5/1993 | Yamagata | 438/620 |
| 5,244,837 | 9/1993 | Dennison | 438/620 |
| 5,286,675 | 2/1994 | Chen et al. | 438/624 |
| 5,459,100 | 10/1995 | Choi | 438/624 |
| 5,563,097 | 10/1996 | Lee | 438/620 |

FOREIGN PATENT DOCUMENTS

| | | | |
|---|---|---|---|
| 5-152449 | 6/1993 | Japan | 438/352 |
| 6-104343 | 4/1994 | Japan | 438/352 |

*Primary Examiner*—T. N. Quach
*Attorney, Agent, or Firm*—Hill & Simpson

[57] ABSTRACT

A method of fabricating a semiconductor device, which is capable of effectively forming high reliability contacts in a plurality of regions to be contacted which are formed at different depths. The method includes the steps of: forming an etching stopper layer on an insulating layer covering a plurality of the regions to be contacted and having a stepped shape; selectively forming, in a lower height area of the insulating layer having the stepped shape, a conductive plug layer connected to a deeper region to be contacted which is formed under the lower height area of the insulating layer; forming a planarization layer on the lower height area of the insulating layer, followed by planarization over the entire surface; and selectively forming contact holes reaching the plug layer and other shallower regions to be contacted, simultaneously.

9 Claims, 5 Drawing Sheets

METHOD OF FABRICATING A SEMICONDUCTOR DEVICE INCLUDING A PLURALITY OF CONTACT REGIONS DISPOSED AT DIFFERENT DEPTHS

BACKGROUND OF THE INVENTION

The present invention relates to a method of fabricating a semiconductor device having at different depths a plurality of regions to be contacted.

In recent years, reduction in DOF (Depth of Focus) margin in a lithography step has become increasingly important with the trend of the reduced design rule, and to extend such a DOF margin in a lithography step, an underlying layer has been required to be subjected to global planarization. However, when different polysilicon (polycrystalline silicon) interconnection layers are respectively provided in a cell region and a peripheral region, for example, in the case of a DRAM (Dynamic Random Access Memory), the depths of contact holes formed in both the regions are made different from each other by global planarization. For example, an aspect ratio (depth/diameter) of a substrate contact hole formed in a peripheral region might be 4 or more under a design rule of 0.25 $\mu$m. In this case, there is a possibility that the depth of the contact hole formed in the peripheral region is different from that of a contact hole formed in a cell region by about 1 $\mu$m. For this reason, it has become still more difficult to form a conductive plug layer in the contact holes formed in both the regions in the same processing step. Hereinafter, a related art method of fabricating a semiconductor device will be basically described with reference to FIGS. 2A to 2E.

As shown in FIG. 2A, an insulting layer 12 made from silicon oxide or the like, which has a stepped surface, is formed on a P-type or N-type semiconducting substrate 11, and a polysilicon layer 13 as an interconnection layer is formed in an intermediate portion of a higher region of the insulating film 12. Here, as shown in FIG. 2B, an interlayer insulating film 14 made from silicon oxide or the like is formed over the entire surface of the insulating film 12 to a thickness of about 300 nm, and as shown in FIG. 2C, the entire surface is polished by a chemical-mechanical polishing (CMP) process or the like to be planarized. After that, as shown in FIG. 2D, a photoresist 15 having a contact hole forming pattern is formed over the entire surface by lithography, followed by anisotropic etching using the photoresist 15 as a mask, to simultaneously form both a contact hole 16 reaching the polysilicon layer 13 and a contact hole 17 reaching the original semiconducting substrate 11 in the lower region. At this time, as shown in FIG. 2D, since the depth from the surface to the polysilicon layer 13 is different from the depth from the surface to the semiconducting substrate 11, when the etching is effected such that the deep contact hole 17 reaches its underlying layer (semiconducting substrate 1), the underlying layer (polysilicon layer 13) of the shallow contact hole 16 is cut by the etching.

Next, as shown in FIG. 2E, the photoresist 15 is removed, and a barrier metal layer 18 is formed by sputtering and a tungsten layer 19 is formed by a BLK-W-CVD (blanket-tungsten-chemical vapor deposition) process in the contact holes 16, 17. More specifically, the barrier layer 18 for improving adhesion strength and the conductive tungsten layer 19 are formed, followed by etching-back over the entire surface, to remove the barrier metal layer 18 and the tungsten layer 19 excluding the interiors of the two contact holes 16, 17. At this time, since an aspect ratio of the contact hole 17 is excessively larger, a void 20 is formed in the tungsten layer 19.

In this way, according to the related art method, when deep and shallow contact holes 17, 16 are simultaneously formed, the underlying layer (polysilicon layer 13) of the shallow contact hole 16 is cut and in the worst cases, it may be pierced. To cope with such an inconvenience, the thickness of the underlying layer (polysilicon layer 13) of the shallow contact hole 16 must be made sufficiently thick, which causes another inconvenience that the height of the stepped portion of the insulating layer 12 is further increased.

The related art presents another disadvantage that it is difficult to form an interconnection at a high reliability because the barrier metal layer 18 is not contact hole 17 and also the void 20 is formed in the tungsten layer 19.

SUMMARY OF THE INVENTION

An object of the present invention is to provide a method of fabricating a semiconductor device, which is capable of simultaneously forming high reliability contacts in a plurality of regions to be contacted.

To achieve the above object, according to a first aspect of the present invention, there is provided a method of fabricating a semiconductor device having at different depths a plurality of regions to be contacted, including the steps of: selectively forming, in a lower height area of the insulating layer covering a plurality of the regions to be contacted and having a stepped shape, a conductive plug layer connected to a deeper region to be contacted which is formed under the lower height area of the insulating layer; forming a planarization layer on the lower height area of the insulating layer, followed by planarization over the entire surface; and selectively forming contact holes reaching the plug layer and other shallower regions to be contacted, simultaneously. The conductive plug layer is preferably formed by selectively forming a barrier metal layer and a tungsten layer.

With this configuration, it is possible to avoid an inconvenience that an underlying layer of a contact hole reaching a shallower region to be contacted is cut upon formation of a contact hole reaching a deeper region to be contacted and also preferably bury the contact hole reaching the deeper region to be contacted with a plug layer, and hence to form high reliability contacts in a plurality of regions to be contacted which are formed at different depths.

According to a second aspect of the present invention, there is provided a method of fabricating a semiconductor device having at different depths a plurality of regions to be contacted; including the steps of: forming an etching stopper layer on an insulating layer covering a plurality of the regions to be contacted and having a stepped shape; selectively forming, in a lower height area of the insulating layer having the stepped shape, a conductive plug layer connected to a deeper region to be contacted which is formed under the lower height area of the insulating layer; forming a planarization layer on the lower height area of the insulating layer, followed by planarization over the entire surface; and selectively forming contact holes reaching the plug layer and other shallower regions to be contacted, simultaneously. The etching stopper layer is preferably a silicon nitride layer. Moreover, the step of planarizing the entire surface preferably includes the steps of: forming a planarization layer over the entire surface; and planarizing the entire surface by chemical-mechanical polishing.

With this configuration, even when there occurs a misalignment between the contact hole reaching the conductive plug layer and the plug layer, the formation of an etching groove in the misalignment portion can be prevented by the etching stopper layer. This is effective to form higher reliability contacts in a plurality of regions to be contacted which are formed at different depths.

BRIEF DESCRIPTION OF THE DRAWINGS

The present invention will be more particularly described with reference to the accompanying drawings, in which.

DETAILED DESCRIPTION OF THE PREFERRED EMBODIMENT

Hereinafter, one embodiment of the present invention will be described in detail with reference to the drawings.

FIGS. 1A to 1G illustrate basic steps of a method of fabricating a semiconductor device according to one embodiment of the present invention. In this embodiment, contacts are formed at different depths in a cell region and a peripheral region, for example, as a DRAM. Here, parts corresponding to those in the related art shown in FIGS. 2A to 2E are indicated by the same characters.

Figure 1A:
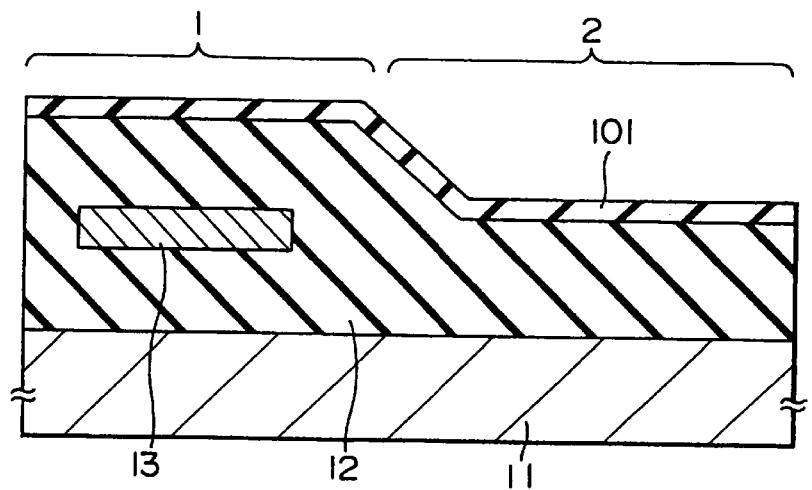
FIGS. 1A to 1G are vertical sectional views of a wafer illustrating basic steps of a method of fabricating a semiconductor device according to one embodiment of the present invention.

As shown in FIG. 1A, an insulating film made from silicon oxide or the like is formed on a P-type or N-type semiconducting substrate 11, a polysilicon layer 13 as an interconnection layer is formed in a cell region 1, and an insulating layer made from silicon oxide or the like is formed over the entire surface, to form an insulating layer 12. In such a state, a stepped portion is formed on the surface of the insulating layer 12 such that the cell region 1 is higher and a peripheral region 2 is lower.

Subsequently, as shown in FIG. 1A, a silicon nitride ($Si_3N_4$ or the like) layer 101 as an etching stopper layer is formed over the entire surface to a thickness of about 100 nm).

Figure 1B:
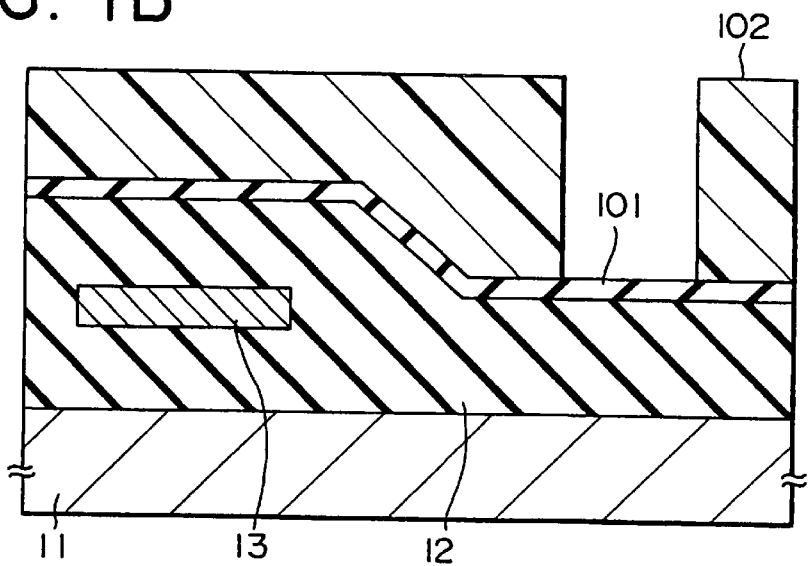
Figure 1C:
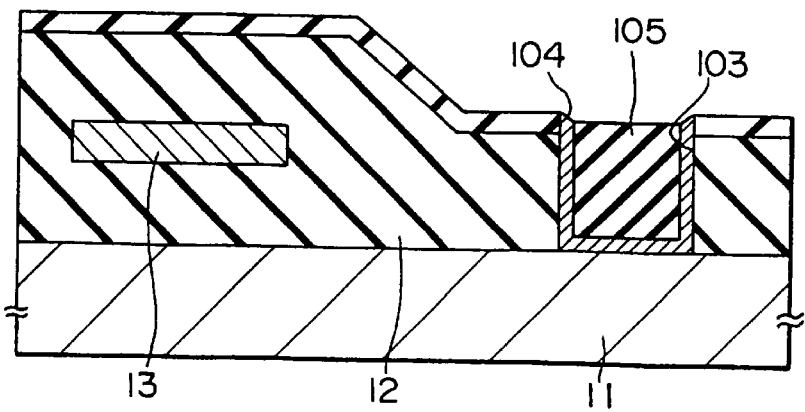

Next, as shown in FIG. 1B, a photoresist 102 having a contact hole forming pattern is formed over the entire surface by lithography, followed by anisotropic etching with the photoresist 102 as a mask, to form a contact hole 103 in the peripheral region 2 of the insulating layer 12 in such a manner that the contact hole 103 reaches the semiconducting substrate 11 as shown in FIG. 1C. The photoresist 102 is removed, and a barrier metal layer 104 is formed over the entire surface containing the contact hole 103 and a tungsten layer 105 is formed thereon using the BLK-W-CVD (Blanket-tungsten-CVD) process. More specifically, the barrier layer 104 for improving adhesion strength is formed by stacking a titanium layer having a thickness of 30 nm and a titanium nitride layer having a thickness of 70 nm over the entire surface by sputtering, and the tungsten layer 105 is formed over the entire surface to a thickness of 600 nm by CVD, followed by etching-back over the entire surface, to remove the barrier metal layer 104 and the tungsten layer 105 excluding the interior of the contact hole 103.

At this time, since an aspect ratio of the contact hole 103 is smaller than that of the contact hole formed in accordance with the related art method, the barrier metal layer 104 can be sufficiently formed on an inner wall surface and on a bottom surface of the contact hole 103 and further the contact hole 103 can be perfectly buried with the tungsten layer 105 without generation of any void which has been at stake in the related art method.

Figure 1D:
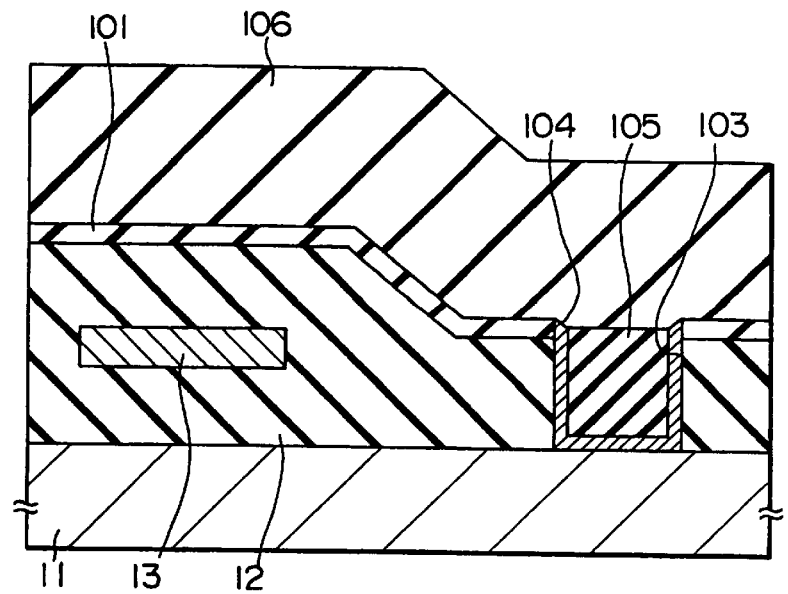

A P-TEOS (Plasma Tetraethyl Orthosilicate) layer 106 is then formed over the entire surface to a thickness of about 1.5 $\mu$m by CVD (see FIG. 1D).

Figure 1E:
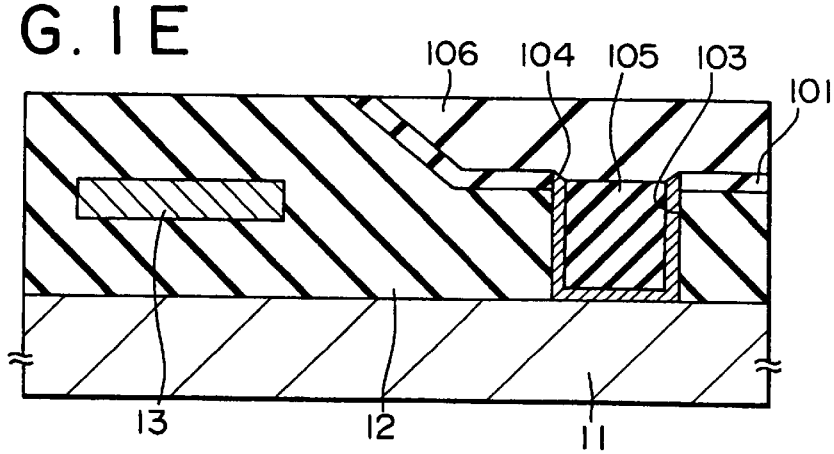

As shown in FIG. 1E, the entire surface is polished by CMP until the silicon nitride layer 101 formed in the cell region 1 is removed. The CMP process polishes an object to be polished using a polishing cloth or the like supplied with a slurry containing abrasive suspended in a solvent (water or the like) having an chemically etching ability, which is modified from a process having mainly used for mirror-like polishing for a silicon wafer. In the CMP process, chemical polishing variables include the kind, pH, and composition of solvent; and mechanical polishing variables include the kind and concentration of slurry, the kind of polishing cloth, the pressure applied to abrasive, and the rotational speed of a carrier (wafer). In the CMP process used in this embodiment, a pressure applied to abrasive is set at 140 $g/cm^2$; a rotational speed of the wafer is set at 30 rpm; and a supply amount of a slurry (polishing solution) is suitably adjusted. Also, the slurry used in this embodiment mainly contains silica particles and potassium hydroxide (KOH) and is suitably adjusted in its pH. It is to be noted that the CMP condition used in this embodiment is not restrictive, and other suitable conditions can be selected as needed.

Figure 1F:
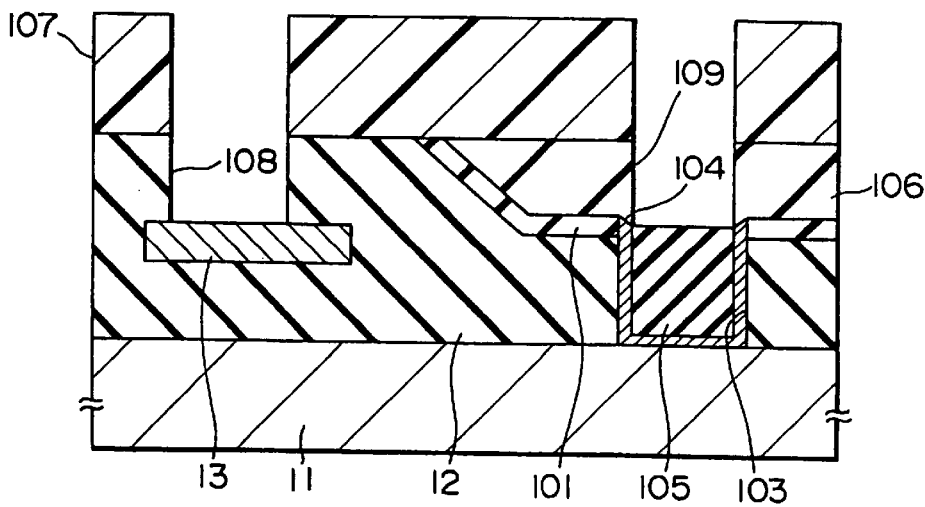

Next, as shown in FIG. 1F, a photoresist 107 having a pattern for forming contact holes in the cell region 1 and the peripheral region 2 is formed over the entire surface by lithography, followed by anisotropic etching using the photoresist 107 as a mask, to form a contact hole 108 in the cell region 1 of the insulating layer 12 in such a manner that the contact hole 108 reaches the polysilicon layer 13 and simultaneously form a contact hole 109 in the peripheral region 2 of the insulating layer 12 in such a manner that the contact hole 109 reaches the tungsten layer 105.

At this time, as shown in FIG. 1F, since the depth from the surface to the polysilicon layer 13 is substantially equal to the depth from the surface to the tungsten layer 105, the formation of the contact hole 108 is completed substantially at the same time when the formation of the contact hole 109 is completed. As a result, differently from the related art method, one underlying layer (polysilicon layer 13) is not cut by etching, thus making it possible to reduce the thickness of the polysilicon layer 13. Moreover, since the silicon nitride layer 101 as an etching stopper layer is formed in the peripheral region 2, even when a misalignment occurs between the contact hole 103 formed in the lower layer and the contact hole 109 formed in the upper layer, there never occurs an inconvenience that the misalignment portion is cut by etching into a groove. Accordingly, it is possible to eliminate the need of forming the contact hole 103 in the lower layer larger than the contact hole 109 in the upper layer. This is advantageous in aiming at high integration.

Figure 1G:
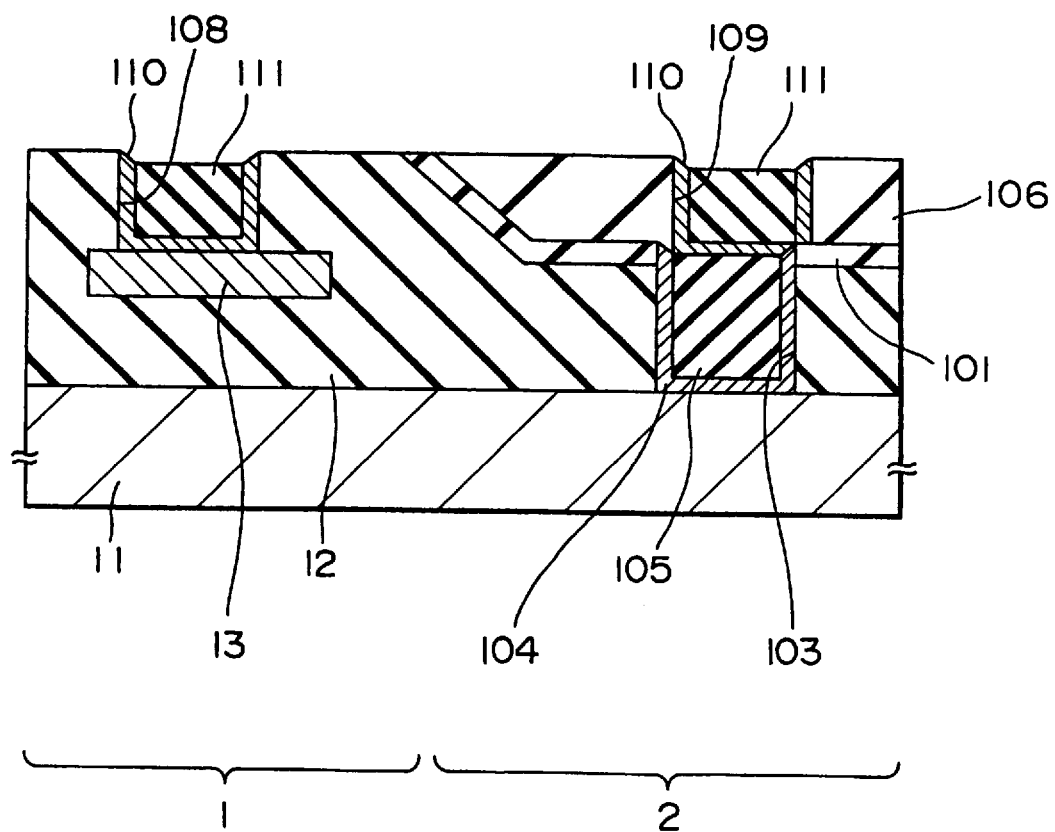
Figure 2A:
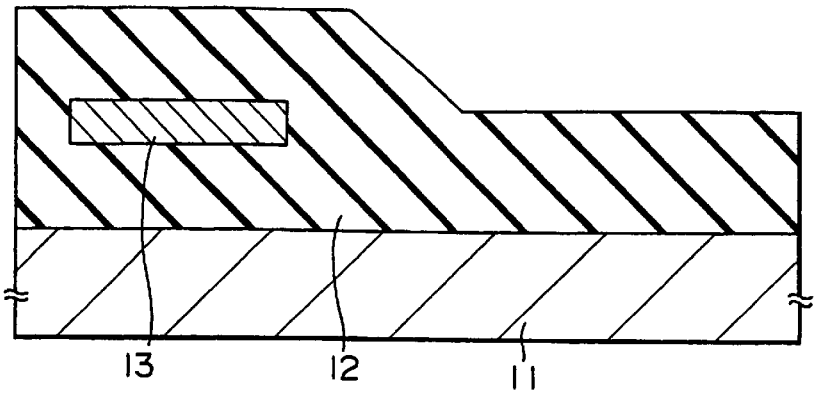
FIGS. 2A to 2E are vertical sectional views of a wafer illustrating basic steps of a prior art method of fabricating a semiconductor device.
Figure 2B:
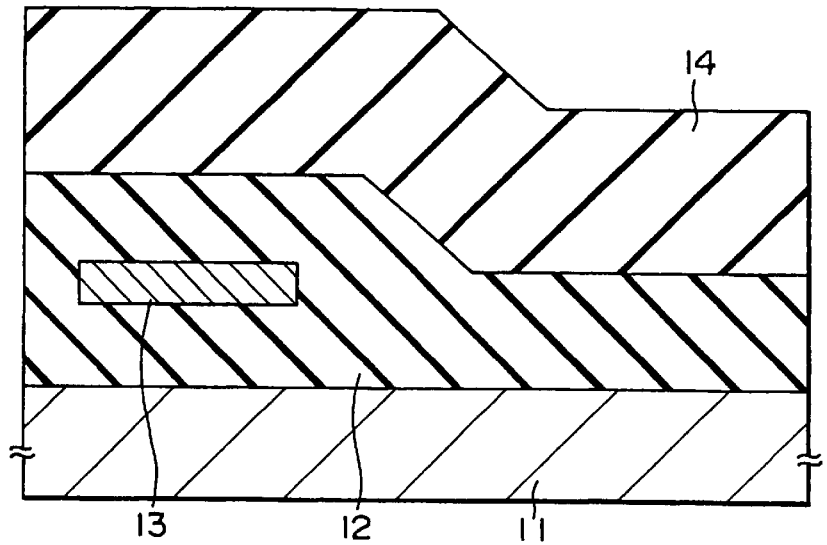
Figure 2C:
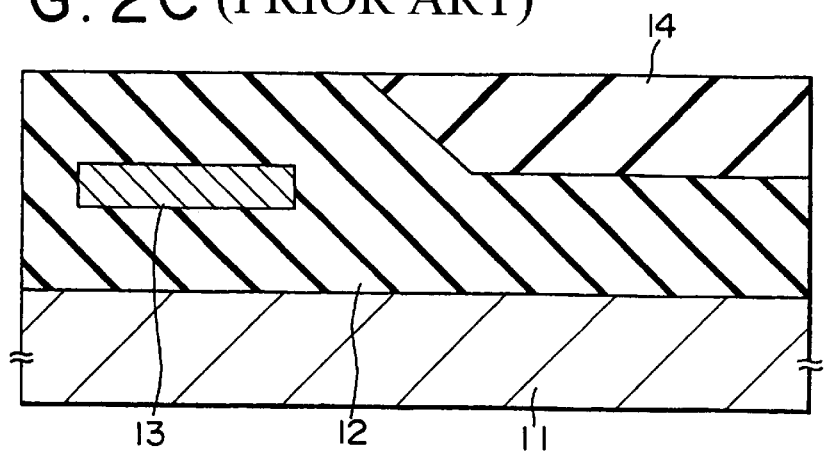
Figure 2D:
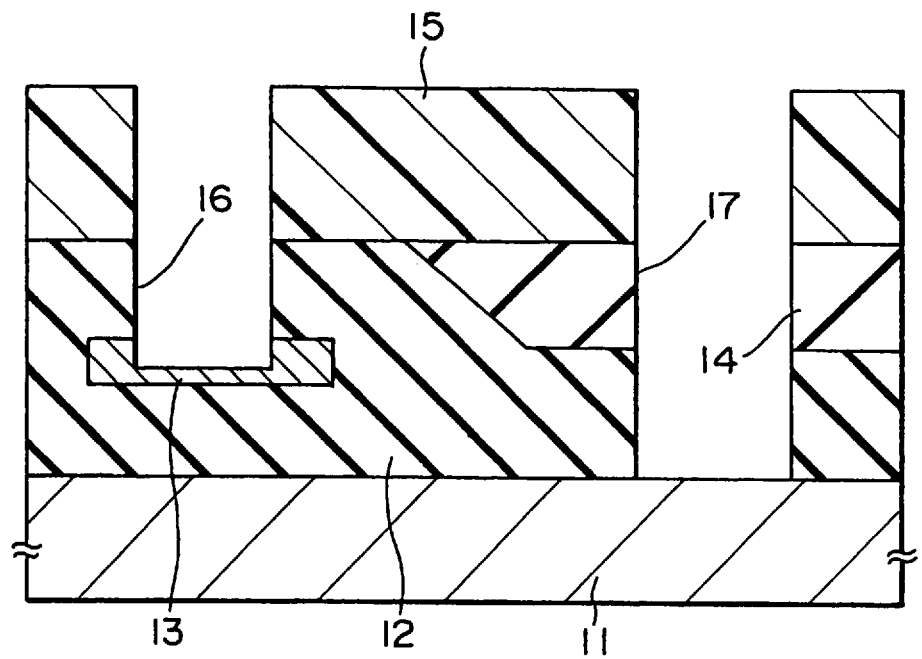
Figure 2E:
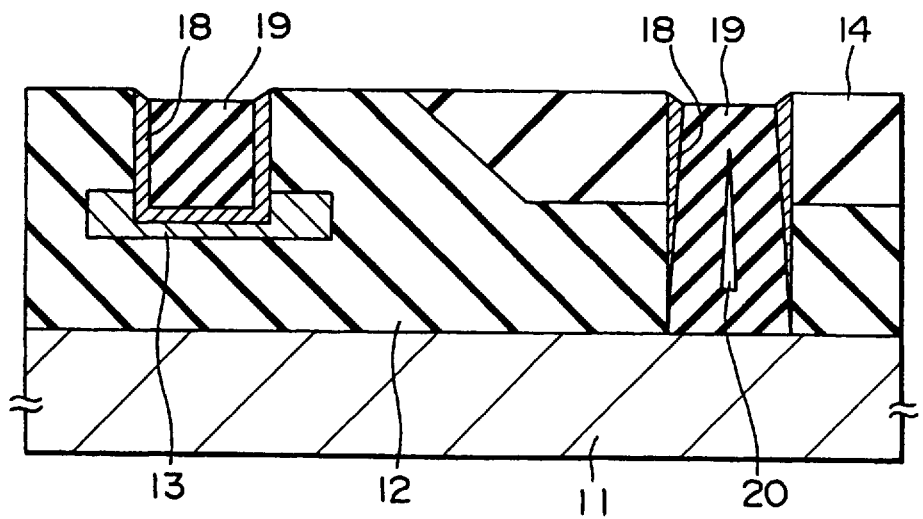

As shown in FIG. 1G, the photoresist 107 is removed, and a barrier metal layer 110 and a tungsten layer 111 are formed in the two contact holes 108, 109 in the same manner as that shown in FIG. 1C. More specifically, the barrier metal layer 110 for improving adhesion strength is formed by stacking a titanium layer having a thickness of 30 nm and a titanium nitride layer having a thickness of 70 nm over the entire surface by sputtering and the tungsten layer 111 is formed over the entire surface to a thickness of 600 nm by CVD, followed by etching-back over the entire surface, to remove the barrier metal layer 110 and the tungsten layer 111 excluding the interiors of the contact holes 108 and 109.

At this time, since an aspect ratio of the contact hole 109 formed in the peripheral region 2 is small just as the formation of the contact hole 103, it is possible to sufficiently form the barrier metal layer 110 on an inner wall surface and on a bottom surface of the contact hole 109 and to perfectly bury the contact hole 109 with the tungsten layer 111 without generation of any void.

As described above, according to this embodiment, since the plug layer (tungsten layer 105) is previously formed in such a manner as to be connected to the region to be contacted (semiconducting substrate 11) which is formed at a deep position in the peripheral region 2 and then the contact holes are simultaneously formed in such a manner as to be connected to the plug layer in the peripheral region 2 and the polysilicon layer 13 in the cell region 1. Accordingly, it is possible to form the contact hole connected to the deep region to be contacted at a high reliability, and to improve the yield in formation of the contact holes. Moreover, even when there occurs a misalignment between the contact holes 109 and 103 formed in the upper and lower layers of the peripheral region 2, it is possible to prevent formation of a groove in the misalignment portion by the presence of the silicon nitride layer 101.

Although the present invention has been described by example of the DRAM, such description is illustrative purposes only, and it is to be understood that the present invention may be applied to other semiconductor devices.

What is claimed is:

1. A method of fabricating a semiconductor device including a plurality of contact regions disposed at different depths comprising the steps of:

providing a stepped semiconductor substrate including an upper portion with at least one first contact region disposed at a first depth and an adjacent lower portion including at least one second contact region disposed at a second depth deeper than said first depth and including an insulating layer covering said upper and lower portions;

selectively forming a conductive plug layer connected to said second contact region in the insulating layer of the lower section;

forming a planarization layer on said insulating layer and planarizing an entire upper surface of the substrate; and thereafter, selectively forming contact holes reaching said conductive plug layer and said first contact region, simultaneously.

2. A method of fabricating a semiconductor device according to claim 1, wherein the step of forming said conductive plug layer includes the step of selectively forming a barrier metal layer and a tungsten layer.

3. A method of fabricating a semiconductor device according to claim 1, wherein the step of forming said contact holes includes the steps of selectively forming a barrier metal layer and a tungsten layer.

4. A method of fabricating a semiconductor device according to claim 1, wherein the step of planarizing includes chemical-mechanical polishing.

5. A method of fabricating a semiconductor device including a plurality of contact regions disposed at different depths comprising the steps of:

providing a stepped semiconductor substrate including an upper portion with at least one first contact region disposed at a first depth and an adjacent lower portion including at least one second contact region disposed at a second depth deeper than said first depth and including an insulating layer covering said upper and lower portions;

forming an etching stopper layer on said insulating layer;

selectively forming a conductive plug layer connected to said second contact region in the insulating layer of the lower section;

forming a planarization layer on said insulating layer and planarizing an entire upper surface of the substrate; and thereafter, selectively forming contact holes reaching said conductive plug layer and said first contact region, simultaneously.

6. A method of fabricating a semiconductor device according to claim 5, wherein said etching stopper layer is a silicon nitride layer.

7. A method of fabricating a semiconductor device according to claim 5, wherein said step of planarizing includes chemical-mechanical polishing.

8. A method of fabricating a semiconductor device according to claim 5, wherein the step of forming said conductive plug layer includes the step of selectively forming a barrier metal layer and a tungsten layer.

9. A method of fabricating a semiconductor device as defined in claim 5, wherein the step of forming said contact holes includes the step of selectively forming a barrier metal layer and a tungsten layer.

* * * * *